United States Patent [19]
Golla et al.

[11] Patent Number: 5,563,816
[45] Date of Patent: Oct. 8, 1996

[54] HIGH-RESOLUTION DIGITAL FILTER

[75] Inventors: Carla Golla, Sesto San Giova; Mauro L. Sali, St. Angelo Lodigiano, both of Italy

[73] Assignee: SGS-Thomson Microelectronics S.r.l., Agrate Brianza, Italy

[21] Appl. No.: 384,211

[22] Filed: Feb. 6, 1995

Related U.S. Application Data

[63] Continuation of Ser. No. 45,384, Apr. 9, 1993, abandoned.

[30]  Foreign Application Priority Data

Apr. 10, 1992 [EP] European Pat. Off. ............... 92830177

[51] Int. Cl.$^6$ .................................................. G06F 15/31
[52] U.S. Cl. .................................................. 364/724.16
[58] Field of Search .................. 364/724.16, 724.01, 364/757

[56]  References Cited

U.S. PATENT DOCUMENTS

| | | | |
|---|---|---|---|
| 4,709,343 | 11/1987 | Van Cang | 364/724.01 |
| 4,811,262 | 3/1989 | White | 364/724.01 |
| 5,053,984 | 10/1991 | Cavallotti et al. | 364/724.16 |
| 5,117,385 | 5/1992 | Gee | 364/757 |

FOREIGN PATENT DOCUMENTS

| | | | |
|---|---|---|---|
| 0078010 | 9/1982 | European Pat. Off. | |
| 2-256307 | 10/1990 | Japan | 364/724.16 |

OTHER PUBLICATIONS

IEEE Journal of Solid State Circuits, vol. 25, No. 6, Dec. 1990 New York, US, pp. 1502–1509, XP176581, Golla et al., "30–MSamples/s Programmmable Filter Processor".

AT&T Technical Journal, vol. 69, No. 5, Oct. 1990, New York, US, pp. 100–115, XP224083, Siller et al., "Application of Memory–Based Digital Filtering to High–Speed Digital Radio".

*Primary Examiner*—Tan V. Mai
*Attorney, Agent, or Firm*—David M. Driscoll; James H. Morris

[57]  ABSTRACT

A high-resolution digital filter including a memory structure receiving as input a sampled digital signal, and an adder chain with delay blocks connected between the adder chain and the memory structure. The adders are connected to memory outputs to convert the input signal into an output signal having predetermined frequency response characteristics. The memory structure includes at least one pair of non-volatile memory elements, each memory element being input one portion only of the sampled signal.

12 Claims, 2 Drawing Sheets

HIGH-RESOLUTION DIGITAL FILTER

This application is a continuation of application Ser. No. 08/045,384, filed Apr. 9, 1993, now abandoned.

BACKGROUND OF THE INVENTION

1. Field of the Invention

This invention relates to a high-resolution digital filter of a type which includes a memory structure receiving as an input a sampled digital signal, and an adder chain, with delay blocks therebetween, which adders are connected to outputs of the memory in order to convert the input into an output signal having predetermined frequency response characteristics.

The invention also relates to a method of filtering a sampled digital code signal.

The invention is more particularly, though not exclusively, directed to digital symmetrical FIR (Finite Impulse Response) filters, and throughout the specification, reference will be made to such an application for convenience of illustration.

2. Discussion of the Related Art

As is known, digital filters are devices intended for converting a sampled signal, received as an input, into another sampled signal having predetermined frequency response characteristics. A sampled signal obviously includes a digital signal which is coded with a predetermined number n of bits on which the filter accuracy, or resolution, is dependent.

Digital filters are primarily used in digital oscilloscopes, spectrum analyzers, and audio and video signal processors. In addition, such filters are gaining increasing acceptance on account of a number of advantages that they afford over corresponding analog filters.

For the same function, in fact, digital filters allow very narrow transmission bands, and are more stable both over time and variations in the power supply and operating temperature.

Digital filters have been implemented within integrated circuits employing digital multipliers and adders.

Digital multipliers can be implemented with a non-volatile memory structure, such as a look-up table, wherein the products of the input signal samples with the coefficients of the filter transfer function are stored.

A structure of this kind is described, for example, in an article entitled "30-MSamples/s Programmable Filter Processor", IEEE Journal of Solid-State Circuits, Vol. 25, No. 6, December 1990, and in Italian Patent Application No. 22954-A/88 filed by this same Applicant which are herein incorporated by reference.

While being in many ways advantageous, this prior approach has a drawback as explained herein below.

When the number of bits used for sampling the input signal is denoted by n, the total number of the filter coefficients is denoted by N, and p denotes the number of bits required to store the product of the samples with the coefficients, then it is found that the memory size is given by 2 nNp. It is readily determined from the above that increasing the sampling of the input signal even by one bit only, to thereby enhance the filter resolution, would result in the memory size being doubled. By way of example, assume a hypothetical transition from 8-bits sampling, typical of current applications, to n=12 bits sampling, as would be highly desirable to improve filtering performance on audio and video signals.

A suitable, hypothetical memory structure would have to be a size sixteen times as large as that required by the former, 8-bits, coding. Such a memory would, therefore, occupy an inordinate amount of space on an integrated circuit. Moreover, it would lack adequate speed of data access because access time is heavily dependent on both the increased coding complexity and the memory size, specifically the number of bits per row. The state of the art offers no satisfactory solution to the problem of circumventing this vast memory expansion whenever improved filtering accuracy or resolution is sought.

The underlying technical problem of this invention is to provide a digital filter, and associated filtering method, having such structural and functional features as to enable high-resolution processing of digital sampled signals coded with a large number of bits, to overcome the limitations of the approaches currently proposed in the state of the art.

The idea on which this invention stands is one of splitting the sampled signal coding into at least two portions and then filtering each portion separately one from the other, and to ultimately re-construct the sampled output signal.

SUMMARY OF THE INVENTION

Based on this idea, the technical problem is solved by a high resolution digital filter including a memory structure which receives a sampled digital signal as an input and includes outputs. Adders are coupled to the outputs of the memory structure to convert the input signal to an output signal having predetermined frequency response characteristics. The memory structure includes first and second non-volatile memory elements, each memory element receiving as an input a different portion of the input signal.

BRIEF DESCRIPTION OF THE FIGURES

The features and advantages of a filter according to the invention will become apparent from the following detailed description of an embodiment thereof, to be read by way of a nonlimiting example in conjunction with the accompanying drawings.

In the drawings.

DETAILED DESCRIPTION

Figure 1:
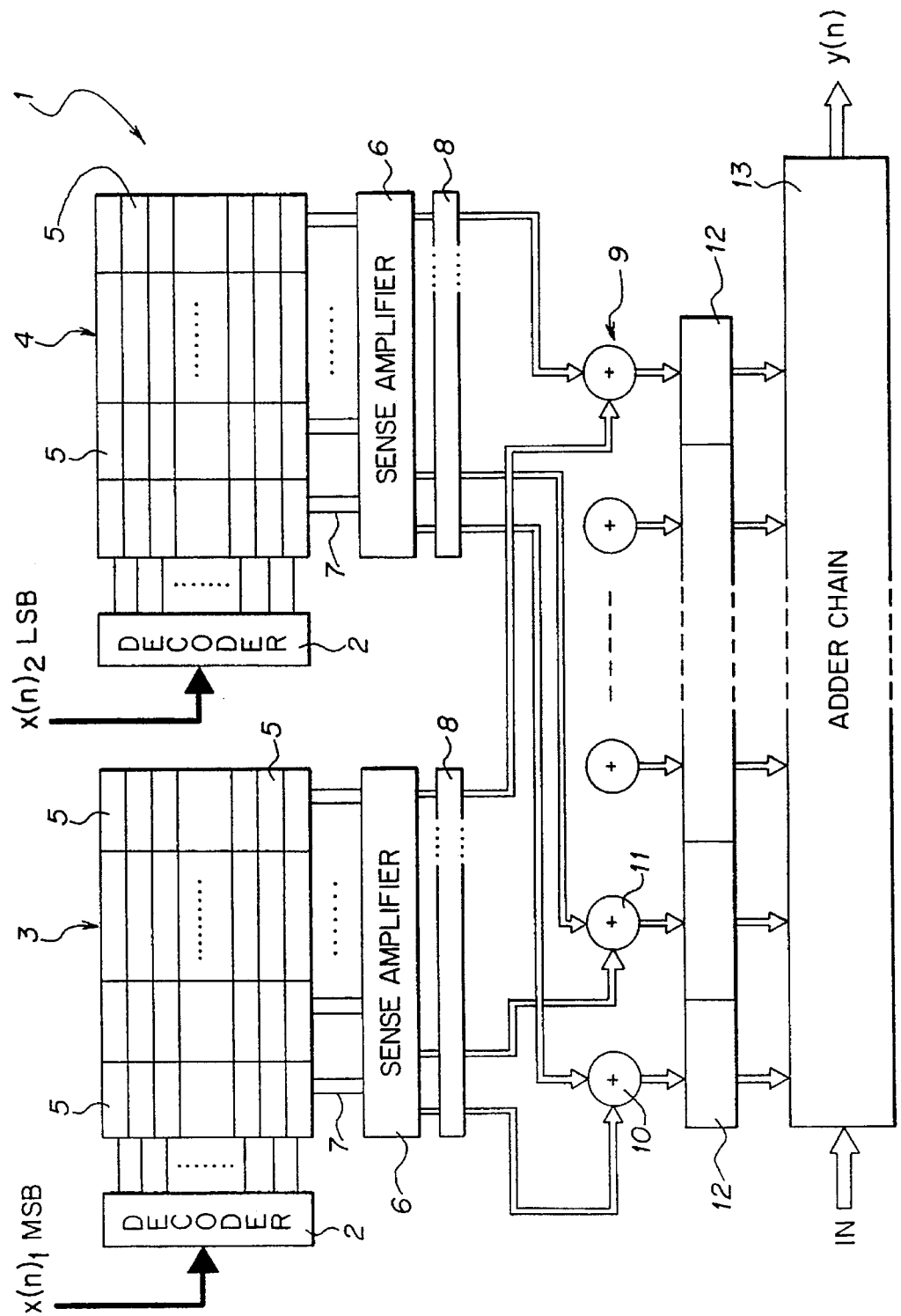
FIG. 1 shows diagrammatically a digital filter embodying the present invention.

With reference to the drawing figures, generally and schematically shown at 1 is a high-resolution digital filter according to the present invention.

This filter 1 is input a given, digital code sampled signal x(n), and outputs another sampled signal y(n) having predetermined frequency response characteristics.

The filter 1 is of the linear phase, FIR (Finite Impulse Response) type, that is to say that the input signal x(n) and output signal y(n) are tied at any discrete time by the following relation:

$$y(n) = \sum_{i=0}^{N-1} a(i) \times (n-i) \quad (1)$$

showing that the output sample y(n) is solely dependent on the current and past input samples.

The coefficients a(i) are a finite number N and can be obtained from the filter response to the pulse. In essence, relation (1) shows that an output sequence y(n) can be obtained from an input sequence x(n) by performing a series of products and sums on the samples that represent the impulse response of the system and the input samples as suitably delayed.

Further, the filter 1 can be identified using a so-called transfer function H(z), as expressed versus a complex variable z, and defined as the ratio of the transform Z of a sequence of output signals y(nT) to the transform of a sequence of input signals x(nT):

$$H(z) = \frac{Y(2)}{X(Z)} = \sum_{i=0}^{N-1} a(i)z - i \quad (2)$$

A circuit-wise synthesis of that transfer function practically enables the filter to be implemented in the form of an integrated circuit, using latches, digital multipliers, and adders arranged in such a way that for each input x(n) an output y(n) is produced in agreement with equation (1).

Figure 3:
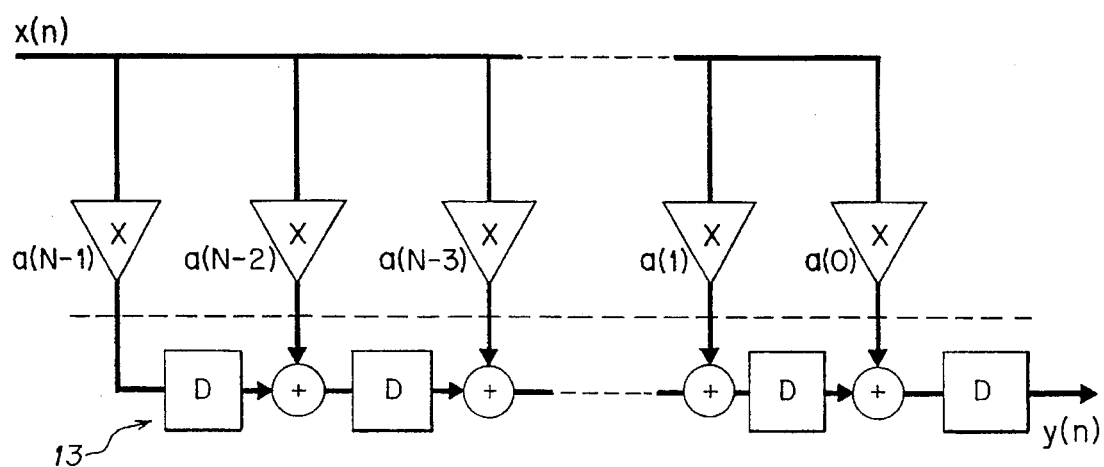
FIG. 3 is a block diagram illustrating a digital filter of the prior art.

For example, shown diagrammatically in FIG. 3 is a digital filter according to the prior art which utilizes a chain of N-1 adders (+), each having first and second inputs, and an output. The output of each adder is connected to the first input of the next adder via a delay block D. The second input of each adder is connected to the output of a corresponding multiplier X. Indicated at a(i) are the frequency response coefficients of the filter associated with the multipliers X.

The structure of FIG. 3 is accomplished on the basis of a transposed transfer function H'(z) of H(z).

The aggregate of N multipliers X may be implemented in an integrated circuit with a memory structure, e.g. a programmable read-only type, to whose inputs the signal x(n) is applied. An example of this implementation is described in Italian Patent Application No. 22954-A/88, which is herein incorporated by reference.

Advantageously, in the filter of this invention the memory structure is implemented with at least one pair of nonvolatile read-only memories 3 and 4.

Each memory 3, 4 receives as input one portion of the sampled signal x(n).

Specifically, the first memory 3 receives the most significant portion x(n)1 of the digital coding of the sampled signal, whereas the other memory 4 receives the least significant portion x(n)2 of that coding.

In a preferred embodiment, the memories are of the programmable read-only EPROM type, and additionally they are of the same size and contain the same data.

Each memory is divided into cells or words 5 of p bits. Each word contains the result of the product of a single value of the input sample with a filter coefficient. A string of N words forms a memory row and there are $2^{n/2}$ such rows.

Each portion x(n)1, x(n)2 of the input signal is applied to the corresponding memory 3, 4 through a decoder 2.

On the output side of each memory is a read block 6 to which the N digital outputs 7 of each memory location pertaining to one coefficient are connected.

A register 8 is provided at the output of each read block 6. Further, an adder group 9 are cascaded to both registers 8 to receive the outputs from such registers.

In other words, a register 8 includes a number of memory elements equal to the number of words in one row of memory 3 or 4, and the first adder 10 in the group 9 is connected to each first memory element of the registers 8, the second adder 11 to each second memory element, and so on.

Associated with each adder in the group 9 is a buffer register 12 receiving the output of each adder and storing the sum result therein.

Finally, an adder chain 13 completes the filter 1 structure, and in a similar manner to prior approaches, enables the sampled signal y(n) to be output. This chain 13 has been also provided with an input IN for use when the filter 1 is to be connected in series with other filters having a similar structure. The adder chain 13 is connected to each buffer register 12.

The filtering method of this invention is described below.

A generic sample of the input signal x(k) at time k is a binary number which is broken out into two contributions x(k)1+x(k)2 defining, in terms of digital coding, the most significant portion and the least significant portion, respectively, of the input sample. These contributions can be regarded as complementing each other, in the sense that their sum gives back the input sample.

The memories 3 and 4 are divided into sections in which the product x(k)*ci is stored, where ci is the multiplicative coefficient of the i-th section.

Based on the algebraic property of product distribution versus addition, the following can be written:

$$x(k)*ci=(x(k)1+x(k)2)*ci=x(k)1*ci+x(k)2*ci \quad (3)$$

In the cells 5 of the memory 3, the product x(k)1*ci is stored, while in the other memory 4 there is stored the product x(k)2*ci. Considering that the input sample is defined by a binary number given by:

$$x(k)=b0+b1*2^1+b2*2^2+\ldots+bn*2^n$$

where n is an even integer, then $$x(k)_2=b0+b1*2^1+b2*2^2+\ldots+b_{(n/2)-1}*2^{(n/2)-1}$$

$$x(k)_1=(b_{n/2}+b_{(n/2)+1}*2^1+b22^2+\ldots+b_{(n-1)}2^{(n/2)-1})2^{n/2}$$

It follows from the previous relations that:

$$x(k)*ci=(b0+b1*2^1+\ldots+b_{(n/2)-1}*2^{(n/2)-1})*ci+(b_{n/2}+\ldots+b_{(n-1)}*2^{(n/2)-1})*2^{n/2}*ci$$

Figure 2:
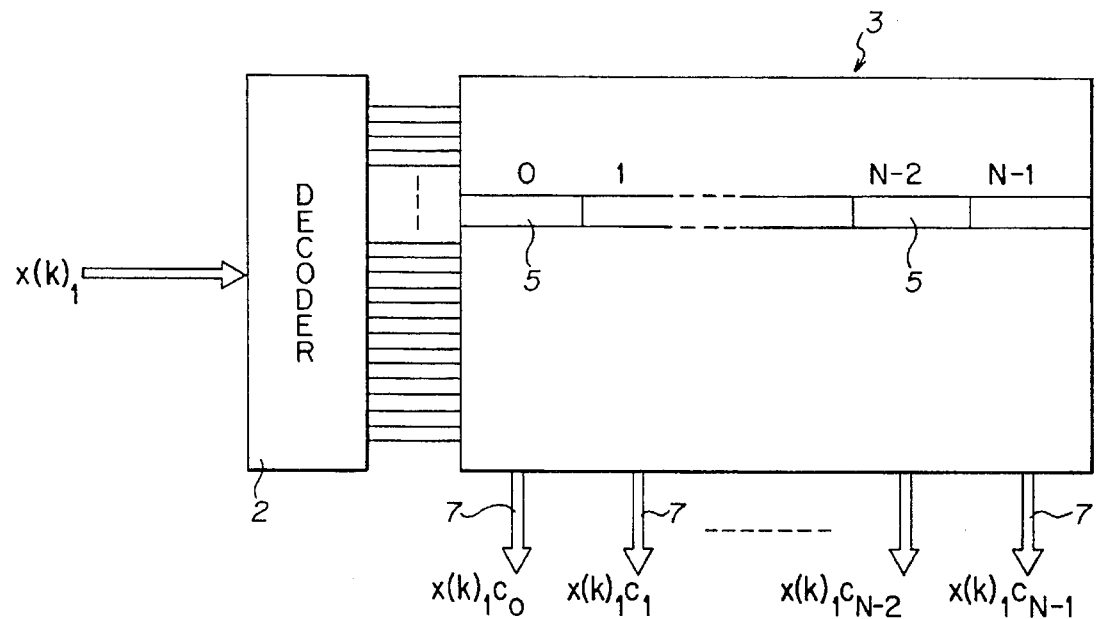
FIG. 2 shows diagrammatically a detail of the filter in FIG. 1.

Each portion x(k)1, x(k)2 of the input signal is applied to a corresponding one of memories 3, 4 through the decoder 2. In summary, the most significant half of the sample bits are decoded, multiplied by an appropriate coefficient, and input to the one memory 3, as shown diagrammatically in FIG. 2, whereas the remaining half are decoded, multiplied by an appropriate coefficient, and input to the other memory 4.

The adder group 9 on the output side of the two memories 3 and 4 allows the signal to be restored to its complete coded state. The fact should not be overlooked, however, that the data output by one of the memories will be "shifted" by n/2 positions toward the most significant portion of the coding. Re-alignment will be provided by the adder group 9 itself.

The digital filter of this invention has a major advantage in that it can occupy a uniquely small silicon space within an integrated circuit. This advantage is reflected in a smooth circuit structure and constant response times being achieved. Since the contents of the memories incorporated in the filter are identical, moreover, the same programming circuit used for the EPROM cells can be used. This enables one to make best use of tremendous savings in time both at the manufacturing and filter programming stages.

Having thus described one particular embodiment of the invention, various alterations, modifications, and improve- ments will readily occur to those skilled in the art. Such alterations, modifications, and improvements as are made obvious by this disclosure are intended to be part of this disclosure thought not expressly stated herein, and are intended to be within the spirit and scope of the invention. Accordingly, the foregoing description is by way of example only is not intended as limiting. The invention is limited only as defined in the following claims and equivalents thereto.

What is claimed is:

1. A high resolution digital filter defined by a number of filter coefficients comprising:

a memory structure having an input for receiving a sampled digital signal as an input signal which consists of a most significant portion and a least significant portion and comprising at least first and second read-only non-volatile memory elements, the first memory element receives through a single input only the most significant portion of the input signal and the second memory element receives through a single input only the least significant portion and each memory element having a plurality of outputs equal in number to the number of filter coefficients of the filter through which partial products of portions of the input signal and filter coefficients are provided;

a plurality of first adders, each having inputs coupled to a corresponding pair of outputs of the first and second memory elements and having an output;

an adder chain connected to the output of the first adder and comprising second adders and delay elements coupled between the second adders; and wherein the first and second memory elements contain substantially the same data.

2. A digital filter as claimed in claim 1 wherein the first and second memory elements are of substantially the same size.

3. A digital filter as claimed in claim 1 wherein the first and second memory elements include EPROMs.

4. A digital filter as claimed in claim 1 wherein the first and second memory elements include a number of rows equal to $2^{(n/2)}$, wherein (n/2) is equal to the number of bits in each input signal portion.

5. A method of filtering a digital coded sampled signal comprising the steps of:

splitting, at discrete time intervals, the digital coded sampled signal into at least first and second complementary portions;

decoding the first and second portions to access memory locations in first and second memory elements having identical data stored therein;

reading from the accessed memory locations of the first and second memory elements an output defining partial products between filter coefficients representing a desired filter frequency response and the first and second portions of the sampled signal, respectively;

splitting the output from the accessed memory locations into individual partial product signals, corresponding to each filter coefficient;

combining the individual partial product signals from the first and second memory elements for a same filter coefficient; and applying the combined individual partial products of each filter coefficient to an adder tree which adds the combined individual partial products together, generating an output signal having characteristics of the sampled signal.

6. A method as claimed in claim 5, wherein the first and second memory elements are first and second EPROM memory elements.

7. A high resolution digital filter comprising:

means for storing at least first and second partial products of filter coefficients and sampled digital signals and including at least first and second non-volatile read-only memory elements, each memory element receiving through a single input a different digital signal portion and providing a plurality of outputs equal in number to a number of filter coefficients in the filter and corresponding to partial products of the different digital signal portions and filter coefficients;

means, coupled to the outputs of the means for storing, for adding the partial products and generating an output signal having predetermined frequency response characteristics; and wherein the first and second memory elements contain substantially the same data.

8. A digital filter as claimed in claim 7 wherein the sampled digital signal portions include a most significant portion and a least significant portion, and wherein the first memory element receives as an input the most significant portion and the second memory element receives as an input the least significant portion.

9. A digital filter as claimed in claim 7 wherein the first and second memory elements are of substantially the same size.

10. A digital filter as claimed in claim 7 wherein the first and second memory elements include EPROMs.

11. A digital filter as claimed in claim 7 wherein the first and second memory elements include a number of rows equal to $2^{(n/2)}$, wherein (n/2) is equal to the number of bits in each digital signal portion.

12. An integrated circuit for filtering an input signal consisting of a first portion and a second portion to provide a filtered digital signal according to a filter with a number of filter coefficients, comprising:

a first read-only nonvolatile memory element having a single input connected to receive the first portion of the input signal and a plurality of outputs equal in number to the number of filter coefficients of the filter, each output providing a product of the first portion of the input signal with one of the filter coefficients;

a second read-only non volatile memory element having a single input connected to receive the second portion of the input signal and a plurality of outputs equal in number to the number of filter coefficients of the filter, each output providing a product of the second portion of the input signal with one of the filter coefficients, wherein the data in the first and second memory elements are the same;

a plurality of first adders, each having inputs connected to corresponding pair of outputs from the first and second memory elements and an output providing a sum of the inputs; and an adder chain comprising a plurality of second adders, each having a first input connected to an output of a previous second adder and a second input connected to the output of one of the plurality of first adders and wherein one of the second adders has an output providing the filtered digital signal.

* * * * *